(12) United States Patent
Lakdawala et al.

(10) Patent No.: US 9,473,085 B2
(45) Date of Patent: Oct. 18, 2016

(54) INPUT SWITCH LEAKAGE COMPENSATION

(71) Applicant: QUALCOMM Incorporated, San Diego, CA (US)

(72) Inventors: Hasnain Mohammedi Lakdawala, San Diego, CA (US); Ojas Mahendra Choksi, San Diego, CA (US); Bin Fan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/491,817

(22) Filed: Sep. 19, 2014

(65) Prior Publication Data
US 2016/0072441 A1  Mar. 10, 2016

Related U.S. Application Data

(60) Provisional application No. 62/048,197, filed on Sep. 9, 2014.

(51) Int. Cl.
| | |
|---|---|
| *H04B 1/44* | (2006.01) |
| *H03F 3/21* | (2006.01) |
| *H04B 1/00* | (2006.01) |
| *H04B 1/04* | (2006.01) |
| *H04B 1/525* | (2015.01) |
| *H03F 1/02* | (2006.01) |
| *H03F 1/22* | (2006.01) |
| *H03F 3/193* | (2006.01) |
| *H03F 3/24* | (2006.01) |

(52) U.S. Cl.
CPC .............. *H03F 3/211* (2013.01); *H03F 1/0261* (2013.01); *H03F 1/223* (2013.01); *H03F 3/193* (2013.01); *H03F 3/245* (2013.01); *H04B 1/0053* (2013.01); *H04B 1/0475* (2013.01); *H04B 1/525* (2013.01); *H03F 2200/294* (2013.01); *H03F 2200/541* (2013.01); *H03F 2203/21106* (2013.01); *H03F 2203/21109* (2013.01)

(58) Field of Classification Search
CPC ................ H03F 1/0205; H03F 3/211; H03F 2200/294; H03F 2203/21106; H04B 1/44
USPC ............................................... 455/78
See application file for complete search history.

(56) References Cited

U.S. PATENT DOCUMENTS

| | | | | |
|---|---|---|---|---|
| 5,940,322 | A * | 8/1999 | Atsumi ................. | G05F 3/262 365/185.18 |
| 6,175,279 | B1 * | 1/2001 | Ciccarelli ............. | H03F 1/0261 330/285 |
| 8,050,634 | B2 * | 11/2011 | Olsson .................. | H04B 1/525 340/539.1 |
| 8,325,632 | B2 * | 12/2012 | Gorbachov ............. | H04B 1/48 343/835 |
| 9,124,354 | B2 * | 9/2015 | Ganti ....................... | H04B 1/48 |
| 2011/0051301 | A1 * | 3/2011 | Thijs .................... | H01L 27/0285 361/57 |
| 2012/0040632 | A1 * | 2/2012 | Mikhemar ............. | H01L 23/60 455/217 |
| 2013/0214865 | A1 * | 8/2013 | Bulzacchelli ......... | H03F 1/0261 330/261 |

FOREIGN PATENT DOCUMENTS

WO  2014094050 A1  6/2014

* cited by examiner

*Primary Examiner* — April G Gonzales
(74) *Attorney, Agent, or Firm* — Procopio, Cory, Hargreaves & Savitch, LLP

(57) ABSTRACT

An apparatus including: a first switch configured to provide a feed-forward path at an input of a first amplifier of a plurality of amplifiers coupled together at a single port, the feed-forward path configured to substantially reduce a leakage current into an input of a second amplifier of the plurality of amplifiers.

21 Claims, 7 Drawing Sheets

INPUT SWITCH LEAKAGE COMPENSATION

CROSS-REFERENCE TO RELATED APPLICATIONS

This application claims the benefit of priority under 35 U.S.C. §119(e) of U.S. Provisional Patent Application No. 62/048,197, filed Sep. 9, 2014, entitled "Input Switch Leakage Compensation." The disclosure of the above-referenced application is incorporated herein by reference.

BACKGROUND

1. Field

This invention relates generally to transceivers, and more specifically, to a reconfigurable multi-mode transceiver.

2. Background

When multiple low noise amplifiers (LNAs) are connected to a single port, leakage from the input switches that connect the LNAs can cause changes in the bias of the LNA. In chips with scaled CMOS devices, electrostatic discharge (ESD) leakage through the input switches can significantly degrade the LNA performance.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

Certain embodiments as described herein provide for injecting a feed-forward current to reduce the impact of the leakage current to the low noise amplifier (LNA). In one embodiment, the feed-forward current is injected between the switches connecting the LNA to the input pin when the main path is turned off. The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
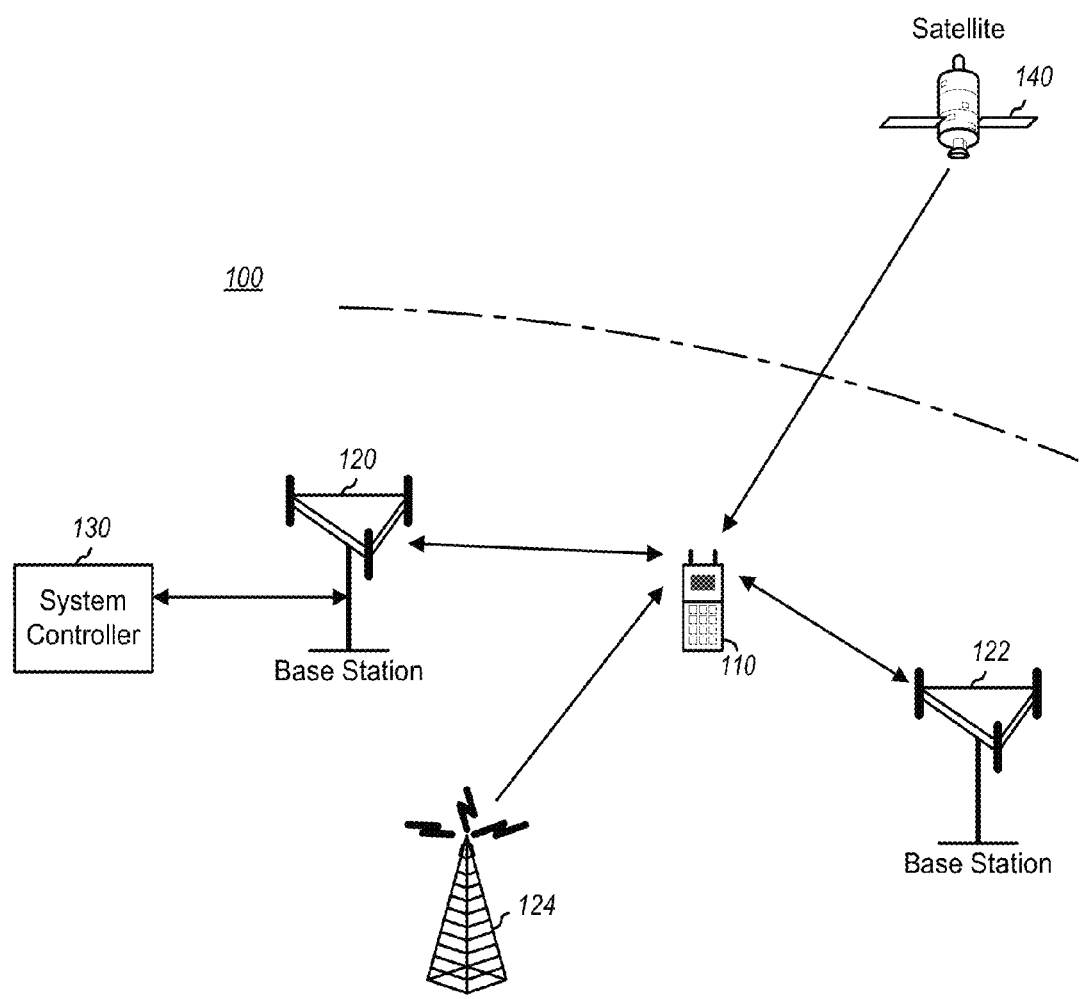
FIG. 1 is a wireless device communicating with a wireless communication system.

FIG. 1 is an exemplary wireless device 110 communicating with a wireless communication system 100. Wireless system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x. Evolution-Data Optimized (EVDO), Time Division Synchronous CDMA (TD-SCDMA), or some other version of CDMA. For simplicity, FIG. 1 shows wireless system 100 including two base stations 120 and 122 and one system controller 130. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 100. Wireless device 110 may also receive signals from broadcast stations (e.g., a broadcast station 124), signals from satellites (e.g., a satellite 140) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Figure 2:
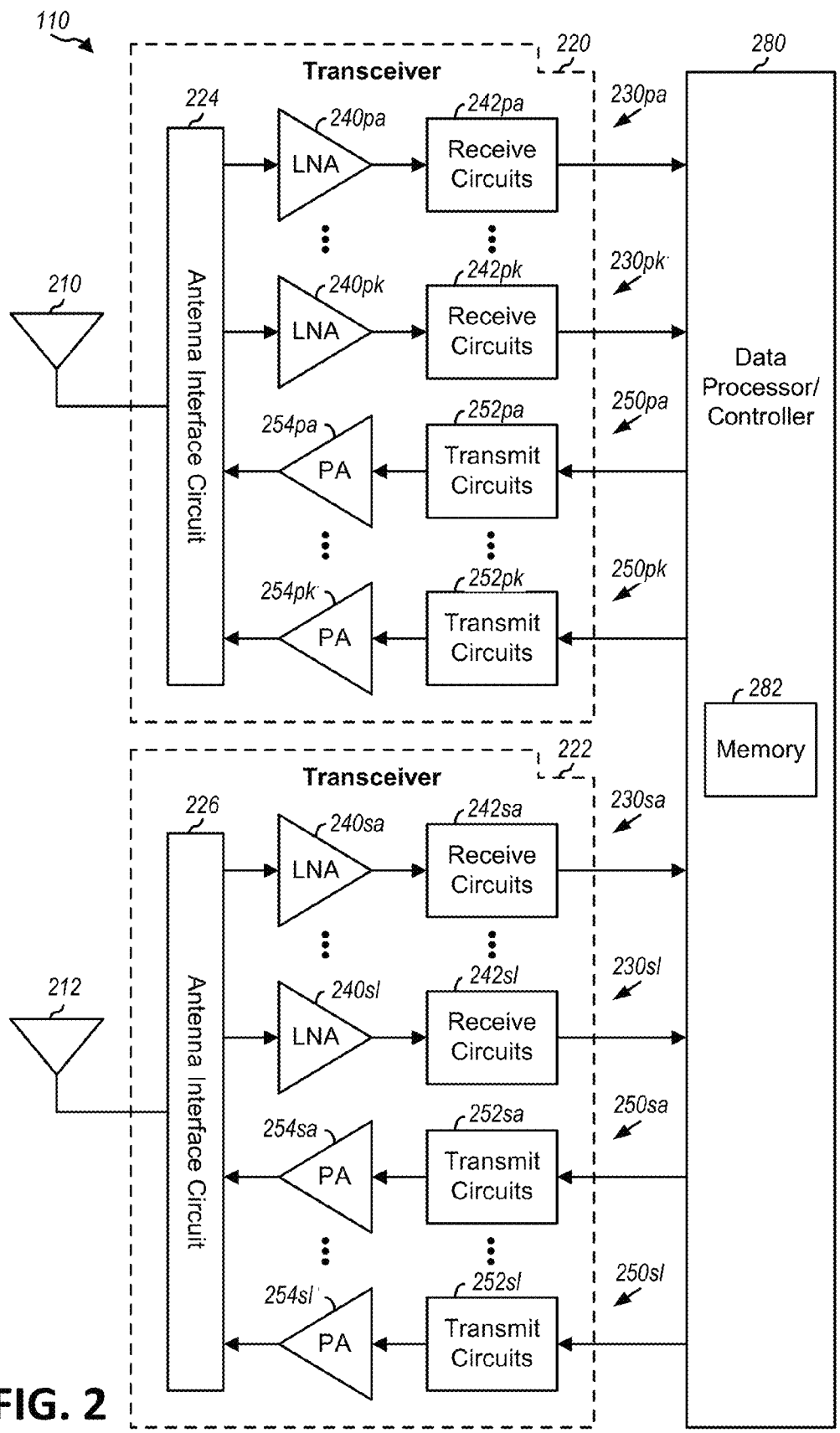
FIG. 2 is a block diagram of an exemplary design of wireless device shown in FIG. 1.

FIG. 2 is a block diagram of an exemplary design of wireless device 110 shown in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (k) receivers 230$pa$ to 230$pk$ and multiple (k) transmitters 250$pa$ to 250$pk$ to support multiple frequency bands, multiple radio technologies, carrier aggregation, etc. Transceiver 222 includes multiple (l) receivers 230$sa$ to 230$sl$ and multiple (l) transmitters 250$sa$ to 250$sl$ to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250pa.

FIG. 2 also shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
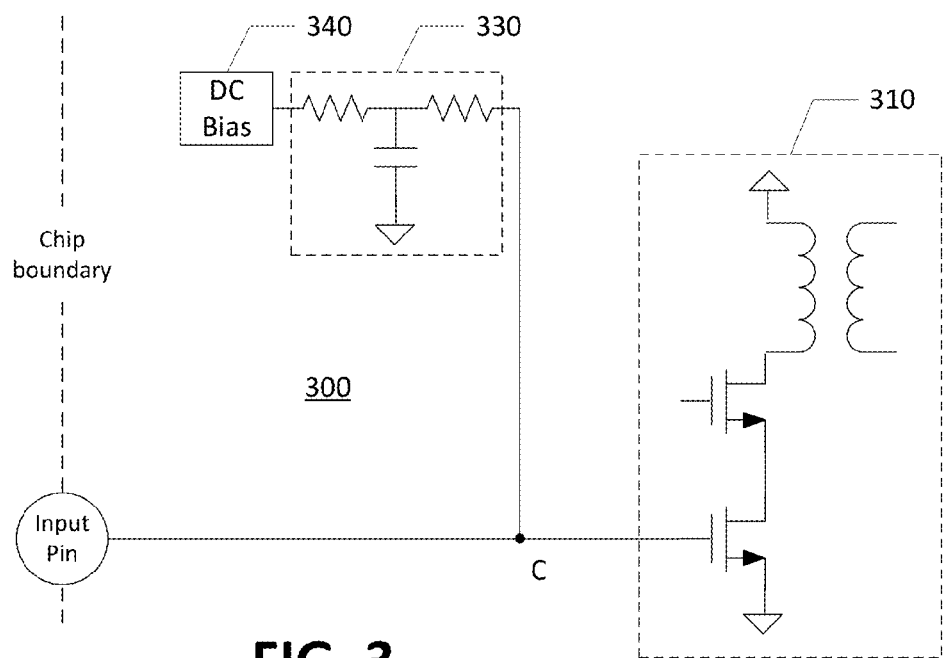
FIG. 3 is a schematic diagram of an exemplary receiver chip including a low noise amplifier (LNA)

FIG. 3 is a schematic diagram of an exemplary receiver chip 300 including a low noise amplifier (LNA) 310. In one embodiment, the receiver chip 300 is used in the wireless device shown in FIG. 2 as receiver 230 and the LNA 310 is used in the wireless device shown in FIG. 2 as LNA 240. To avoid noise figure degradation and large area consumption from on-chip AC coupling, the LNA 310 uses direct DC coupling with a DC bias circuit 340. Further, to keep the flicker and other low frequencies from the bias circuit 340, an RC filter 330 is used. This causes the current at the input pin (i.e., at point C) to be very high impedance which exposes the input pin to the DC bias voltage of the LNA in a regular operation.

Figure 4:
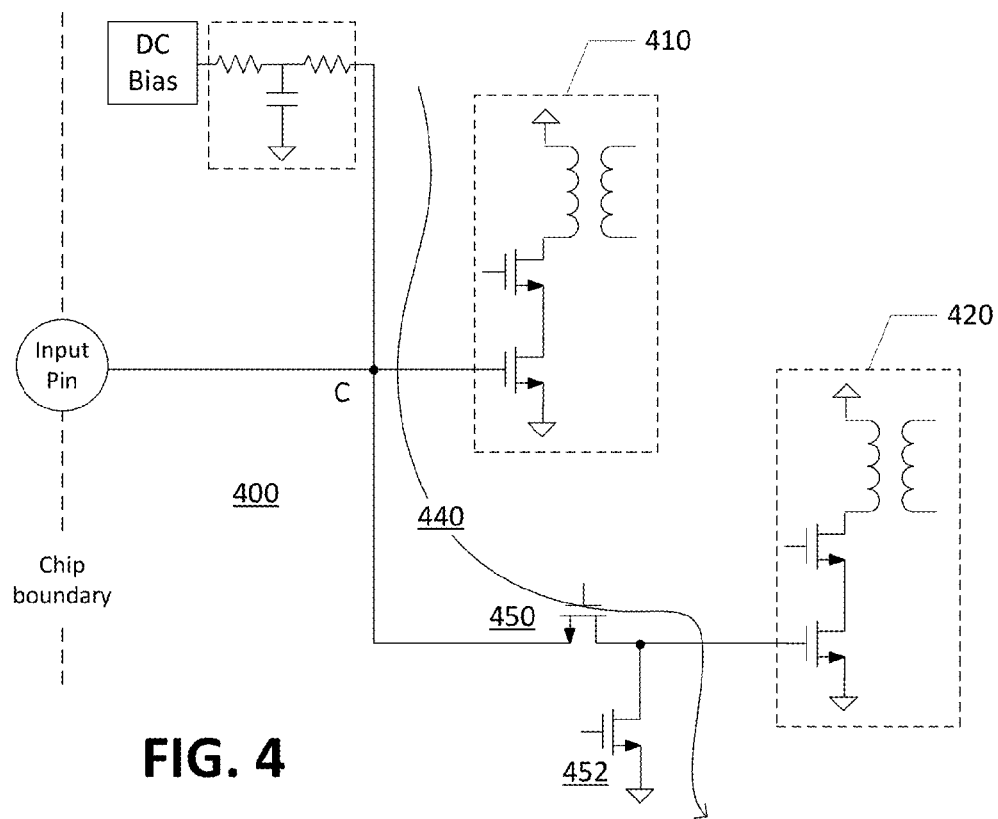
FIG. 4 is a schematic diagram of an exemplary receiver chip including two low noise amplifiers (LNAs) connected to a single port (i.e., point C)

FIG. 4 is a schematic diagram of an exemplary receiver chip 400 including two low noise amplifiers (LNAs) 410, 420 connected to a single port (i.e., point C). In one embodiment, the receiver chip 400 is used in the wireless device shown in FIG. 2 as receiver 230 and the LNA 410 or 420 is used in the wireless device shown in FIG. 2 as LNA 240. To connect the second LNA 420 to the same port (i.e., at point C) as the input of the first LNA 410, on-chip switches 450, 452 are coupled to the input of the second LNA 420. Thus, with feature scaling and/or feature addition, such as in the illustrated configuration of FIG. 4, a leakage current 440 can be introduced through the added switches 450, 452 which can cause changes in the bias of the first LNA 410. For example, the leakage current 440 through the input switches 450, 452 causes increased IR drop at the input of the first LNA 410 (i.e., at point C), especially at the fast hot corners of the silicon process. This can cause a reduced gain in the first LNA 410 due to lower input bias voltage. Further, electrostatic discharge (ESD) leakage can also de-bias the LNA 410. Traditionally, these degradations were managed by adding an AC coupling capacitor, by reducing filter resistance, or by increasing the capacitor. However, these solutions all increase the noise figure and/or consume significant area on the chip.

Figure 5:
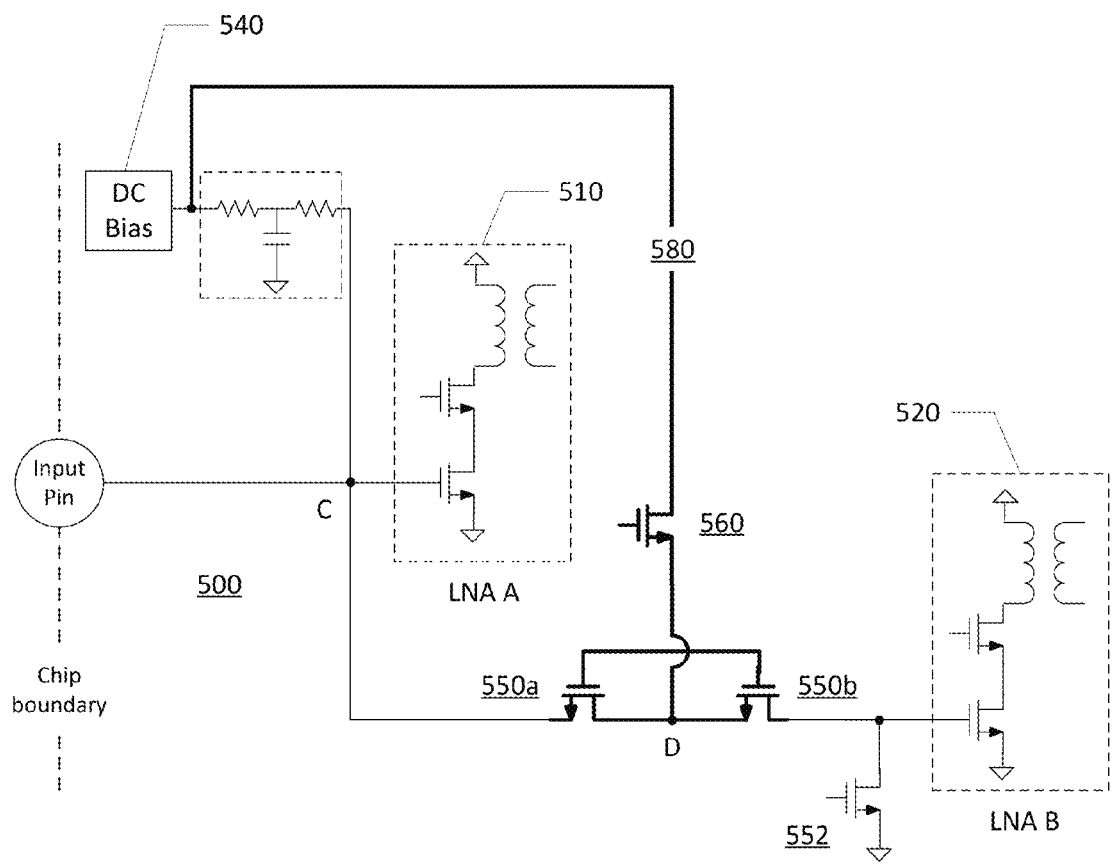
FIG. 5 is a schematic diagram of an exemplary receiver chip including a plurality of LNAs (e.g., LNA A and LNA B) connected to a single port (i.e., point C) in accordance with one embodiment of the present disclosure.

FIG. 5 is a schematic diagram of an exemplary receiver chip 500 (partial view) including a plurality of LNAs (e.g., LNA A and LNA B) connected to a single port (i.e., point C) in accordance with one embodiment of the present disclosure. In one embodiment, the exemplary receiver chip 500 is a transceiver chip that can be used as a transceiver 220 or 222 shown in FIG. 2. Since the schematic diagram shown in FIG. 5 is a partial view of the exemplary receiver chip 500, the chip 500 can include other elements shown in FIG. 2 for transceiver 220 or 222 such as an antenna interface circuit, receive circuits, power amplifiers, and transmit circuits.

In the illustrated embodiment of FIG. 5, the receiver chip 500 includes two LNAs 510, 520 connected to point C, which is a common connection point connecting the two LNAs 510, 512. The common connection point is also connected to an input pin of the chip. To connect the second LNA 520 to the common connection point (i.e., at point C), on-chip switches 550a, 550b, 552 are coupled to the input of the second LNA 520. In one embodiment, the switches 550a, 550b, 552 are configured with complementary metal-oxide-semiconductor (CMOS) transistors. The CMOS switches of the illustrated embodiment can be either n-type CMOS (NMOS) or p-type CMOS (PMOS) transistors.

In the illustrated embodiment of FIG. 5, LNA A 510 is in an operating mode, while LNA B 520 is in an idle mode. Thus, in this embodiment, a single switch (i.e., switch 450 in FIG. 4) has been split into two switches 550a, 550b. Further, a feed-forward current from the output of the DC bias circuit 540 is injected into the connection point (i.e., point D) between the two switches 550a, 550b using a feed-forward switch 560. Thus, in the illustrated embodiment in which LNA A 510 is operating and LNA B 520 is in an idle mode with switches 550a, 550b turned off, a bypass path 580 is provided and the feed-forward current is routed into the switches 550a, 550b at point D to substantially reduce and redirect the leakage current going into point C. Therefore, the bypass path 580 and the feed-forward switch 560 provide an alternative path for the leakage current which would otherwise have flowed out of the DC bias circuit 540 and into the input of the LNA A 510. As stated above, this would have caused increased IR drop at the input of the LNA A 510 (i.e., at point C), especially at the fast hot corners of the silicon process. When the feed-forward current is routed or injected into the switches 550a, 550b at point D, the switches 550a, 550b are turned off (in open positions) so that the injected feed-forward current does not affect the operations of LNA A 510 or LNA B 520. Moreover, since LNA B 520 is in an idle mode when the feed-forward current is routed or injected into the switches 550a, 550b at point D, switch 552 is turned on to ground the input of LNA B 520. In an alternative embodiment in which LNA A 510 is in an idle mode and LNA B 520 is in an operating mode, the bypass path 580 and the switches 550a, 550b, 552 need to be moved to the input of LNA A 510 from the input of LNA B 520.

Figure 6:
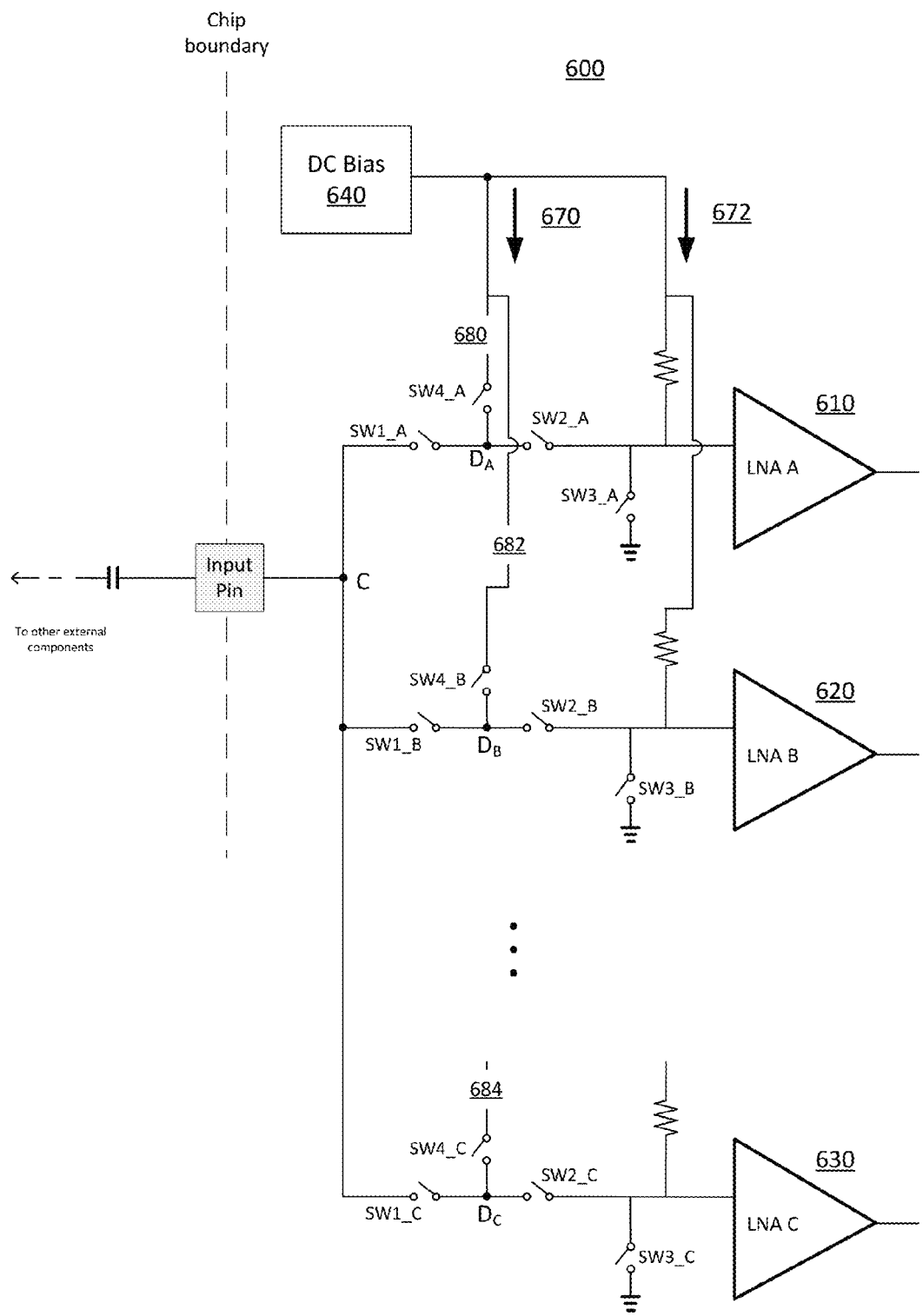
FIG. 6 is a generalized schematic diagram of an exemplary receiver chip including a plurality of LNAs (e.g., LNA A, LNA B, . . . LNA C) connected to a single port (i.e., point C) in accordance with another embodiment of the present disclosure.

FIG. 6 is a generalized schematic diagram of an exemplary receiver chip 600 including a plurality of LNAs (e.g., LNA A, LNA B, . . . LNA C) connected to a single port (i.e., point C) in accordance with another embodiment of the present disclosure. In one embodiment, the exemplary receiver chip 600 is a transceiver chip that can be used as a transceiver 220 or 222 shown in FIG. 2. In the illustrated embodiment of FIG. 6, the receiver chip 600 includes three LNAs 610, 620, 630 connected to point C through switches SW1_A, SW2_A, switches SW1_B, SW2_B, and switches SW1_C, SW2_C, respectively. Additional LNAs can be connected to the single port. Switches SW4_A, SW4_B, and SW4_C provide bypass paths 680, 682, 684 for injecting the feed-forward current 670 to points $D_A$, $D_B$, and $D_C$, respectively, and minimize the leakage current 672 into the inputs of the LNAs 610, 620, 630. Further, switches SW3_A, SW3_B, SW3_C ground inputs of LNA A 610, LNA B 620, and LNA C 630, respectively. In one embodiment, switches SW1_A, SW2_A, SW3_A, SW4_A, SW1_B, SW2_B, SW3_B, SW4_B, SW1_C, SW2_C, SW3_C, SW4_C are configured with CMOS transistors. The CMOS switches of the illustrated embodiment can be configured with either NMOS or PMOS transistors.

Figure 7:
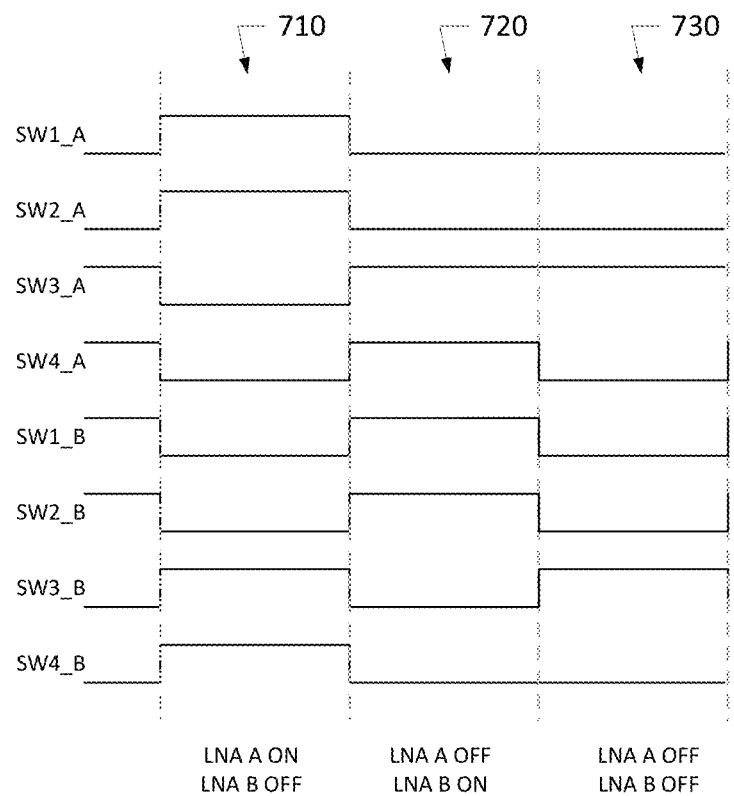
FIG. 7 is a timing diagram of switches SW1_A, SW2_A, SW3_A, SW4_A for LNA A and switches SW1_B, SW2_B, SW3_B, SW4_B for LNA B.

FIG. 7 is an exemplary timing diagram 700 of switches SW1_A, SW2_A, SW3_A, SW4_A for LNA A 610 and switches SW1_B, SW2_B, SW3_B, SW4_B for LNA B 620. Thus, the timing diagram 700 of FIG. 7 assumes that only LNA A 610 and LNA B 620 are connected to the common connection point (i.e., point C).

In a first configuration 710, when LNA A 610 is turned on and LNA B 620 is turned off, switches SW1_A, SW2_A are activated (i.e., in closed positions) to connect the input of LNA A 610 to point C, while switches SW1_B, SW2_B are deactivated (i.e., in open positions) to disconnect the input of LNA B 620 from point C. In this configuration (i.e., LNA A 610 is turned on and LNA B 620 is turned off), switches SW3_A, SW4_A are deactivated (i.e., in open positions), while switches SW3_B, SW4_B are activated (i.e., in closed positions) to inject the feed-forward current 670 to point $D_B$ through bypass path 682 and minimize the leakage current 672 into the input of LNA A 610, and also ground the input of LNA B 620.

In a second configuration 720, when LNA A 610 is turned off and LNA B 620 is turned on, switches SW1_A. SW2_A are deactivated (i.e., in open positions) to disconnect the input of LNA A 610 from point C, while switches SW1_B, SW2_B are activated (i.e., in closed positions) to connect the input of LNA B 620 to point C. In this configuration (i.e., LNA A 610 is turned off and LNA B 620 is turned on), switches SW3_B, SW4_B are deactivated (i.e., in open positions), while switches SW3_A, SW4_A are activated (i.e., in closed positions) to inject the feed-forward current 670 to point $D_A$ through bypass path 680 and minimize the leakage current 672 into the input of LNA B 620, and also ground the input of LNA A 610.

In a third configuration 730, when both LNA A 610 and LNA B 620 are turned off, switches SW1_A, SW2_A. SW4_A, SW1_B, SW2_B, SW4_B are deactivated (i.e., in open positions) to disconnect both inputs of LNA A 610 and LNA B 620 from point C. In this configuration (i.e., LNA A 610 is turned off and LNA B 620 is turned off), switches SW3_A, SW3_B are activated (i.e., in closed positions) to ground both inputs of LNA A 610 and LNA B 620.

Figure 8:
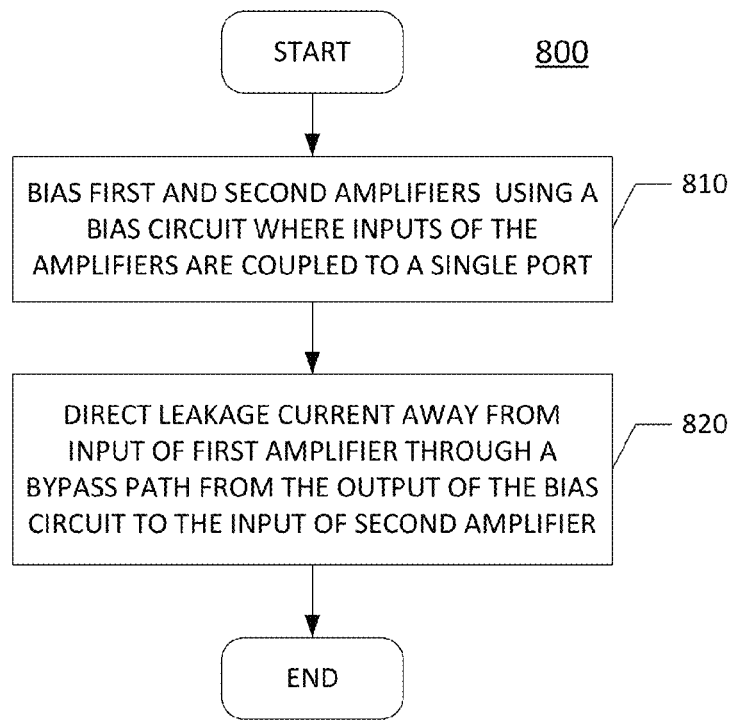
FIG. 8 is a flow diagram of an exemplary method for routing a feed-forward current using a bypass path in accordance with one embodiment of the present disclosure.

FIG. 8 is a flow diagram of an exemplary method 800 for routing a feed-forward current using a bypass path in accordance with one embodiment of the present disclosure. The method 800 is suitable for use with the receiver chip 500 comprising the plurality of LNAs 510, 520 or with the receiver chip 600 comprising the plurality of LNAs 610, 620, 630. At block 810, the first and second amplifiers are biased using a bias circuit where inputs of the amplifiers are coupled to a single port. Then, at block 820, a leakage current is directed away from the input of the first amplifier as a feed-forward current through a bypass path from the output of the DC bias circuit 540 to a connection point between the two switches 550a. 550b situated at the input of the second amplifier. The feed-forward current is directed through the bypass path using a feed-forward switch 560.

Figure 9:
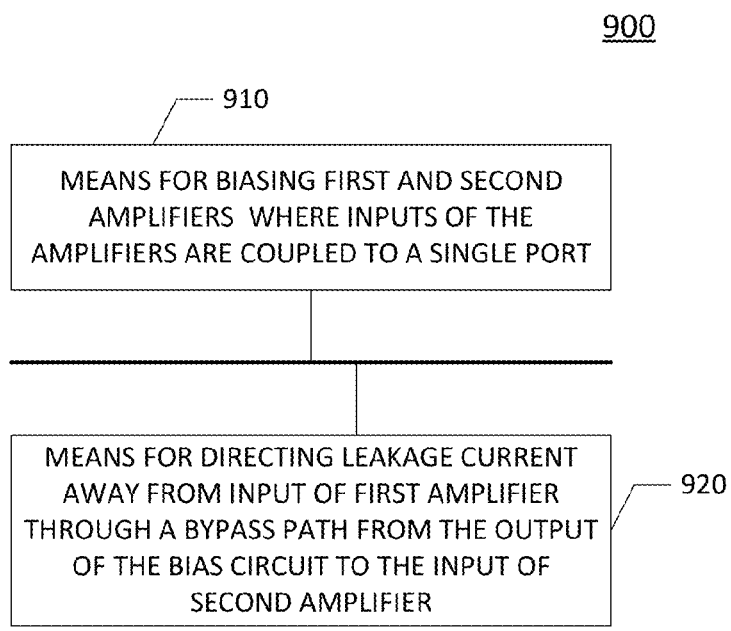
FIG. 9 is a functional block diagram of an exemplary apparatus configured for routing a feed-forward current using a bypass path in accordance with one embodiment of the present disclosure.

FIG. 9 is a functional block diagram of an exemplary apparatus 900 configured for routing a feed-forward current using a bypass path in accordance with one embodiment of the present disclosure. In the illustrated embodiment of FIG. 9, the apparatus 900 comprises a first means 910 for biasing first and second amplifiers where inputs of the amplifiers are coupled to a single port. The apparatus 900 also includes a second means 920 directing a leakage current away from the input of the first amplifier as a feed-forward current through a bypass path from the output of the DC bias circuit 540 to a connection point between the two switches 550a, 550b situated at the input of the second amplifier. The feed-forward current is directed through the bypass path using a feed-forward switch 560.

Receiver chips and LNAs described herein may be implemented on an IC, an analog IC, an RFIC, a mixed-signal IC, an ASIC, a printed circuit board (PCB), an electronic device, etc. The receiver chips and LNAs may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), hetero-junction bipolar transistors (HBTs), high electron mobility transistors (HEMTs), silicon-on-insulator (SOI), etc.

An apparatus implementing the receiver chips and LNAs described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a bias circuit configured to provide a bias voltage to a plurality of amplifiers, inputs of the plurality of amplifiers are coupled to a single port; and
a first switch configured to direct a leakage current away from an input of a first amplifier of the plurality of amplifiers through a bypass path from an output of the bias circuit to an input of a second amplifier of the plurality of amplifiers.

2. The apparatus of claim 1, each of the plurality of amplifiers includes a low noise amplifier.

3. The apparatus of claim 1, the bias voltage is a DC bias voltage.

4. The apparatus of claim 1, the first amplifier is an operating mode and the second amplifier is in an idle mode.

5. The apparatus of claim 4, further comprising
a second switch coupled to the second amplifier, the second switch configured to ground the input of the second amplifier.

6. The apparatus of claim 1, further comprising
a third amplifier coupled to the single port.

7. The apparatus of claim 1, further comprising
third and fourth switches configured to connect the single port to the input of the second amplifier.

8. The apparatus of claim 7, wherein the bypass path is coupled to a connection point between the third and fourth switches.

9. The apparatus of claim 8, wherein the first switch is configured to connect the bias circuit to the connection point when the third and fourth switches are in open states.

10. The apparatus of claim 7, further comprising
fifth and sixth switches configured to connect the single port to the input of the first amplifier.

11. The apparatus of claim 10, the first amplifier is an idle mode and the second amplifier is in an operating mode.

12. The apparatus of claim 11, further comprising
a seventh switch coupled to the first amplifier, the seventh switch configured to ground the input of the first amplifier.

13. An apparatus comprising:
means for biasing first and second amplifiers, inputs of the first and second amplifiers are coupled to a single port; and
means for directing a leakage current away from an input of the first amplifier through a bypass path from an output of the means for biasing to an input of the second amplifier.

14. The apparatus of claim 13, further comprising
means for grounding the input of the second amplifier.

15. The apparatus of claim 13, further comprising
means for connecting the single port to the input of the second amplifier.

16. The apparatus of claim 15, the means for directing is configured to connect the bypass path at the means for connecting.

17. The apparatus of claim 13, further comprising
means for connecting the single port to the input of the first amplifier.

18. The apparatus of claim 13, further comprising
means for grounding the input of the first amplifier.

19. An apparatus comprising:
a plurality of amplifiers, inputs of the plurality of amplifiers are coupled to a single port;
a bias circuit configured to provide a bias voltage to plurality of amplifiers; and
a first switch configured to direct a leakage current away from an input of a first amplifier of the plurality of amplifiers through a bypass path from an output of the bias circuit to an input of a second amplifier of the plurality of amplifiers.

20. The apparatus of claim 19, further comprising
second and third switch coupled to the input of the second amplifier,
the first switch coupled to a connection point between the second switch and the third switch.

21. The apparatus of claim 19, wherein the apparatus is a receiver.

* * * * *